(12) United States Patent
Lee

(10) Patent No.: US 7,285,847 B2
(45) Date of Patent: Oct. 23, 2007

(54) CHIP STACK PACKAGE, CONNECTING BOARD, AND METHOD OF CONNECTING CHIPS

(75) Inventor: Jae-Hyuk Lee, Cheonan (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 230 days.

(21) Appl. No.: 10/845,138

(22) Filed: May 14, 2004

(65) Prior Publication Data
US 2004/0253762 A1    Dec. 16, 2004

(30) Foreign Application Priority Data
Jun. 11, 2003    (KR) .................... 10-2003-0037531

(51) Int. Cl.
*H01L 23/02* (2006.01)
*H05K 7/00* (2006.01)
(52) U.S. Cl. .............. 257/686; 257/690; 257/730; 361/735; 361/790
(58) Field of Classification Search .......... None
See application file for complete search history.

(56) References Cited

U.S. PATENT DOCUMENTS 6,297,551 B1 * 10/2001 Dudderar et al. .......... 257/723
6,323,060 B1 * 11/2001 Isaak .......................... 438/109
6,480,389 B1 * 11/2002 Shie et al. .................. 361/707
6,861,737 B1 *  3/2005 Jeong et al. ................ 257/680
2003/0067264 A1 *  4/2003 Takekuma .................. 313/501

FOREIGN PATENT DOCUMENTS

| JP | 2001-274324 | 10/2001 |
|----|-------------|---------|
| JP | 2002-057279 | 2/2002 |
| KR | 10-0206893 | 4/1999 |

* cited by examiner

*Primary Examiner*—Alonzo Chambliss
(74) *Attorney, Agent, or Firm*—Harness, Dickey & Pierce

(57) ABSTRACT

A chip stack package, a connecting board, and a method of connecting multiple, stacked semiconductor chips multi-chip package comprises a plurality of stacked packages including an upper package and a lower package. Each connecting board includes a board, including a wall and an opening, the wall including a top portion and a side portion, wherein the lower package may be secured in the opening; and a connecting portion, located on the top portion and the side portion of the wall. The respective packages are electrically connected by the connecting portion with one or more elements of each board/package pair being in vertical or substantially vertical alignment.

31 Claims, 5 Drawing Sheets

CHIP STACK PACKAGE, CONNECTING BOARD, AND METHOD OF CONNECTING CHIPS

CROSS REFERENCE TO RELATED APPLICATIONS

This U.S. non-provisional patent application claims priority under 35 U.S.C. 119 from Korean Patent Application 2003-37531 filed Jun. 11, 2003, the entire contents of which are hereby incorporated by reference.

BACKGROUND OF THE INVENTION

1. Field of the Invention

The present invention relates to a semiconductor chip package, a connecting board, and a method of connecting multiple, stacked semiconductor chips.

2. Description of the Related Art

The electronics industry continues to seek products that are lighter, faster, smaller, multi-functional, more reliable and/or more cost-effective. In order to meet the requirement of the electronics industry, circuit chips are becoming highly integrated.

However, enhancing the integration density of chips is expensive and has technical limitations. Therefore, 3-D type semiconductor packaging technologies have been adopted. In general, a multi-chip package made by stacking a plurality of chips in a package is known. For instance, in a stacked package manufactured by a combination of two semiconductor memory devices, the memory capacity of the semiconductor is doubled. Chip stacking configurations may introduce difficulties such as a more complex manufacturing process and/or complications or limitations associated with increased package thickness.

In order to manufacture a multi-chip package using conventional ball grid array type packages, the upper chip is usually the same size or larger than the lower chip. A spacer is inserted between the chips, because the upper chip may contact one or more bonding wires of the lower chip. The spacer helps reduce or prevent electrical interference caused by one or more bonding wires of the lower chip contacting an underside of the upper chip.

Exemplary spacers used for manufacturing a multi-chip packages are shown in FIG. 1 and FIG. 2. FIG. 1 is a cross-sectional view of an example of a conventional multi-chip package.

The conventional multi-chip packages 10 and 20 of FIGS. 1 and 2, respectively, may include a printed wiring board 11, a lower chip 14 disposed on the printed wiring board 11 with adhesive 15, an upper chip 19 secured by liquid adhesive 17 including a plurality of insulating fillers 18 on the lower chip 14. In general, a bonding wire 16 is electrically connected to one end of each metal pattern 13 formed on the printed wiring board 11. The other end of the metal pattern 13 may be electrically connected to another electrical device, such as another electrical device at the rear side of the printed wiring board 11. The same or larger sized upper chip 19 compared with the lower chip 14 may contact the top of the bonding wire 16 during the upper chip 19 bonding process. Electrical interference may occur when the bonding wires 16 contact the underside of the upper chip 19.

As described above, a spacer, such as an insulating filler 18 may be inserted between the lower chip 14 and the upper chip 19. The insulating filler 18 allow sufficient height for the bonding wire 16 loops. The upper chip 19 may still be pressed down during a chip bonding process and/or wire bonding process, even though the height of the insulating filler 18 is sufficient. For instance, the wires 16 may be connected to bonding pads (not shown) on the upper chip 19 by thermal compression method.

FIG. 2 is a cross-sectional view of another example of another conventional multi-chip package 20. The conventional multi-chip package 20 of FIG. 2 may include a printed wiring board 21, a lower chip 24 secured to the printed wiring board 21 with adhesive 25, and an upper chip 29 secured by insulating adhesive tape 27 on the lower chip 24. Similarly, the bonding wires 26 may be affected by the underside of the upper chip 29 during a chip bonding process and/or wire bonding process. The insulating adhesive tape 27 can be inserted between the lower chip 24 and the upper chip 29, and the insulating adhesive tape 27 may have sufficient height for the bonding wire 26 loops.

In the conventional multi-chip packages 10 and 20, the upper chip 19 lower chip 14 arrangement has some limitations. The multi-chip package with two or more chips is vertically thicker due to the spacer, either the insulating filler or the insulating adhesive tape. In addition, increasing the number of mounting chips used in a conventional multi-chip package increases the likelihood of wire bonding failure, electrical failure, and/or reliability issues.

SUMMARY OF THE INVENTION

In an exemplary embodiment of the present invention, a multi-chip package includes a plurality of stacked packages including an upper package and a lower package. Each package includes a connecting board having a central opening pocket and metal patterns, at least one chip disposed on the connecting board, a plurality of metal patterns formed on the connecting board, a plurality of bonding wires providing electrical connections between bonding pads and connecting board pads. The respective packages are electrically connected by the connecting board of the upper package to the lower package, the connecting boards of the upper and lower packages being in vertical alignment on the printed wiring board.

In the multi-chip package made by stacking a plurality of the above-described chips, each of the chips is electrically connected to the connecting boards through metal patterns. In an exemplary embodiment, the first connecting portion and the second connecting portion of the two adjacent stacked packages may be positioned in vertical alignment with each other. In an exemplary embodiment, the metal patterns are formed on a top portion of a pocket wall and on side portion which is located outside the pocket. In an exemplary embodiment, the connecting board pads may be formed on a peripheral portion of the chip in the pocket.

In an exemplary embodiment, the multi-chip package may comprise an encapsulation material protecting the chip (s) from the external environment. In an exemplary embodiment, solder ball pads may be formed on the rear side of the printed wiring board. The solder ball pads may be electrically connected to a plurality of the connecting board pads on the connecting board through the metal patterns.

In another exemplary embodiment, the chips which are located on the pockets of the multi-chip package are face down on the printed wiring board, because the portion of the pocket is sealed without encapsulation materials. In an exemplary embodiment, the connecting board may be formed of the first board body and the second board body disposed surrounding on the top side of the first board body. The connecting board may be formed by creating the central opening, located the chip on a single integral board body.

In another exemplary embodiment, a connecting board includes a board, including a wall and an opening, the wall including a top portion and a side portion, wherein the lower package may be secured in the opening and a connecting portion, located on the top portion and the side portion of the wall.

In another exemplary embodiment, a connecting method provides a first connecting board, including a wall and an opening, the wall including a top portion and a side portion, wherein the lower package may be secured in the opening and a connecting portion, located on the top portion and the side portion of the wall, provides a second connecting board for the upper package, in vertical or substantially vertical alignment with the first connecting board and connects the upper package and the lower package via the connecting portion.

BRIEF DESCRIPTION OF THE DRAWINGS

Exemplary embodiments of the present invention will be readily understood with reference to the detailed description provided below when read in conjunction with the accompanying drawings, wherein the same reference numerals are used to designate similar or corresponding structural elements, in which.

DETAILED DESCRIPTION OF EXEMPLARY EMBODIMENTS

Exemplary embodiments of the present invention are described below with reference to the accompanying drawings.

Figure 1:
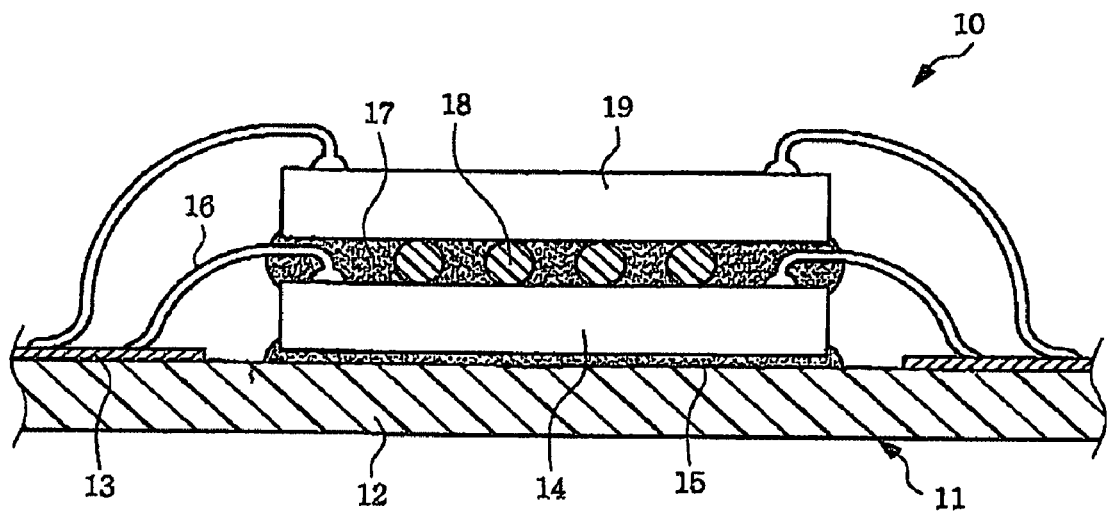
FIG. 1 is a cross-sectional view of an example of a conventional multi-chip package.
Figure 2:
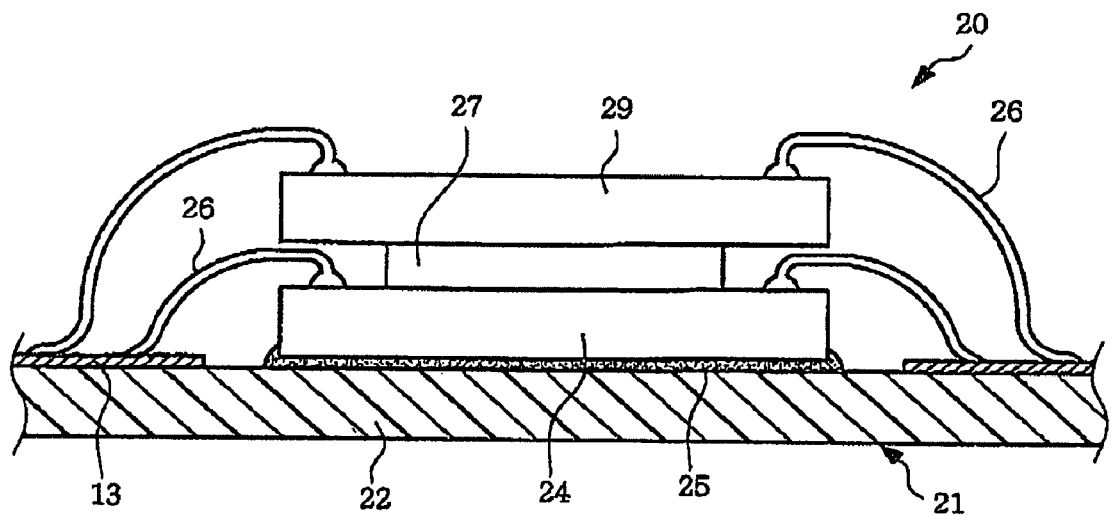
FIG. 2 is a cross-sectional view of another example of a conventional multi-chip package.
Figure 3:
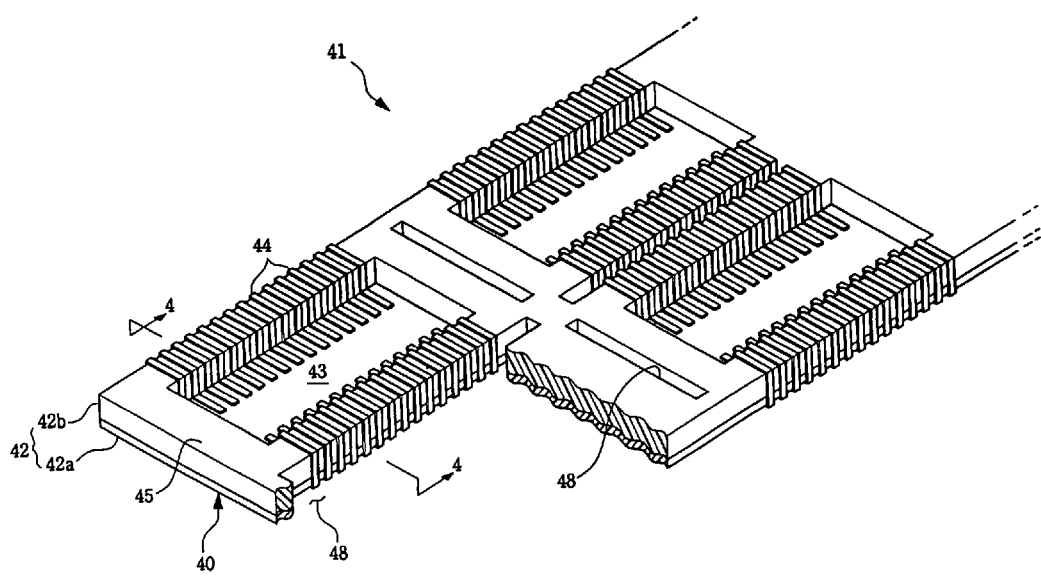
FIG. 3 is a plan view of a board used for manufacturing a multi-chip package according to an exemplary embodiment of the present invention.
Figure 4:
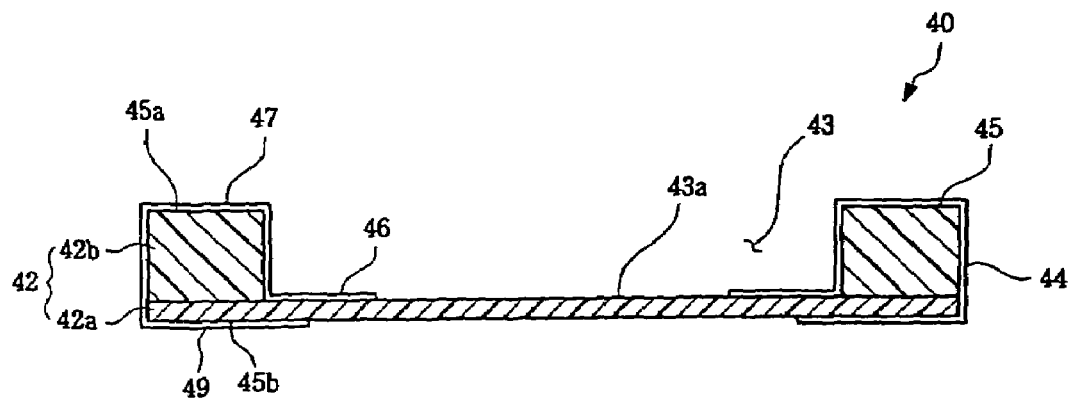
FIG. 4 is a cross-sectional view of a connecting board according to an exemplary embodiment of the present invention as illustrated in FIG. 3 taken generally along line 4-4.

The structure of a connecting board used for a multi-chip package in exemplary embodiments of the present invention is described referring to FIGS. 3-9. As shown in FIG. 3 and FIG. 4, a connecting board strip 41 may provide a plurality of connecting boards 40 for manufacturing a plurality of multi-chip packages, simultaneously. In an exemplary embodiment of the present invention, the connecting board strip 41 may provide connecting boards 40 as two (or more) rows partially separated by a plurality of slots 48 between the connecting boards 40.

The connecting board 40 includes a pocket 43 disposed in the center portion of a pocket wall 45 of a board body 42. Metal patterns 44 may be formed on a top portion 45a of the pocket wall 45 and on a side portion which is located outside the pocket 43. As shown in FIG. 4, a connecting board pad 46 may be placed on a peripheral portion of the pocket 43 and be electrically connected to a first connecting portion 47. The first connecting portion 47 may be electrically connected to a second connecting portion 49, which is located outside the pocket 43. A side opposite the active surface of the chip is disposed on the top area 43a of the pocket 43 and secured by an adhesive, such as Ag epoxy.

In an exemplary embodiment, the first connecting portion 47 of a first connecting board 40 is connected to the second connecting portion 49 of another connecting board 40 for manufacturing the multi-chip package by stacking the packages. In an exemplary embodiment, the connecting portions 47, 49 of the two adjacent stacked packages are in vertical alignment with each other. In an exemplary embodiment, the first and second connecting portion 47, 49 are positioned on the top portion 45a and the bottom portion 45b of the pocket wall 45, respectively.

In an exemplary embodiment, the connecting board 40 may be made of one or more insulating materials and the metal patterns 44 may be formed by Au plating. In an exemplary embodiment, the connecting board 40 may be a taped circuit board, a printed wiring board or a ceramic board. In an exemplary embodiment, the connecting board 40 may be manufactured by removing portions to create the central opening, a chip may be placed in the central opening and repeated to manufacture a stack of two or more board bodies. In an exemplary embodiment, the connecting board 40 may include a first board body 42a of planar shape and a second board body 42b, disposed surrounding a planar side of the first board body 42a.

In accordance with an exemplary embodiment of the invention, the metal patterns 44 may be formed as Au or Au alloys on the outside of the board body 42. In an exemplary embodiment, each of the packages may be electrically connected to each other may be stacked by a thermal compression method.

Figure 5:
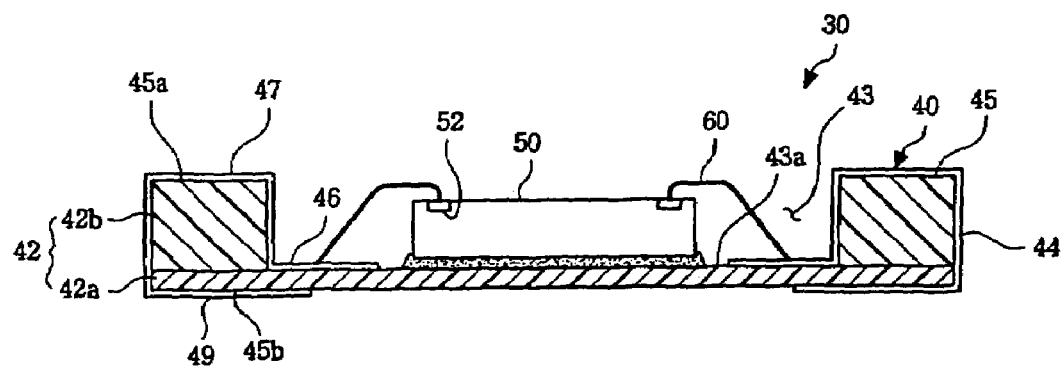
FIG. 5 is a cross-sectional view of an exemplary embodiment of the present invention as illustrated in FIG. 4 with a first chip attached on a connecting board.

As illustrated in FIG. 5, a chip 50 may be secured to the top area 43a of the pocket 43 by an adhesive, such as an epoxy. One end of a bonding wire 60 may be electrically connected to a corresponding bonding pad 52 of the chip 50 and the other end of the bonding wire 60 may be electrically connected to the corresponding connecting board pad 46. The bonding wire 60 may be positioned below the top portion 45a of the pocket wall 45. Reverse wire bonding may be used to reduce the height of the bond wire loop. The reverse wire bonding may be electrically connected to the corresponding connecting board pad 46 by a ball bonding method and then connected to the corresponding bonding pad 52 of the chip 50 by a stitch bonding method. The connecting board strip 41 may be separated by cutting the slots 48.

Figure 6:
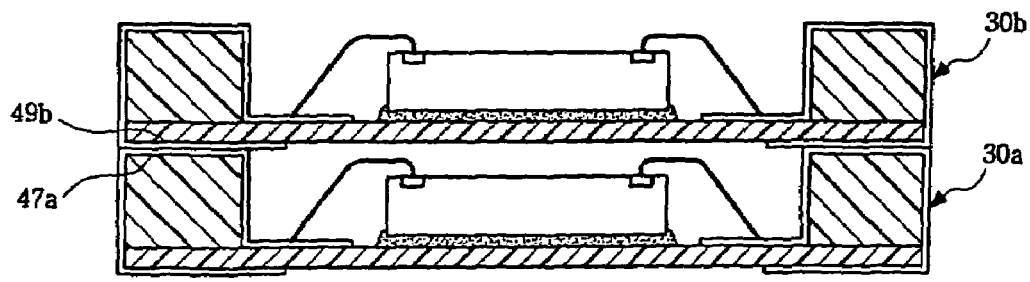
FIG. 6 is a cross-sectional view of a multi-chip package according to an exemplary embodiment of the present invention as illustrated in FIG. 5 with a second chip attached on another connecting board as a 3-D type semiconductor package.

As illustrated in FIG. 6, each package 30a, 30b of the multi-chip package may be stacked. The connecting portions 47a, 49b of the two adjacent stacked packages 30a, 30b are vertically aligned with each other. Although two packages 30a, 30b are shown in FIG. 6 two or more packages may also be stacked utilizing this technique.

Figure 7:
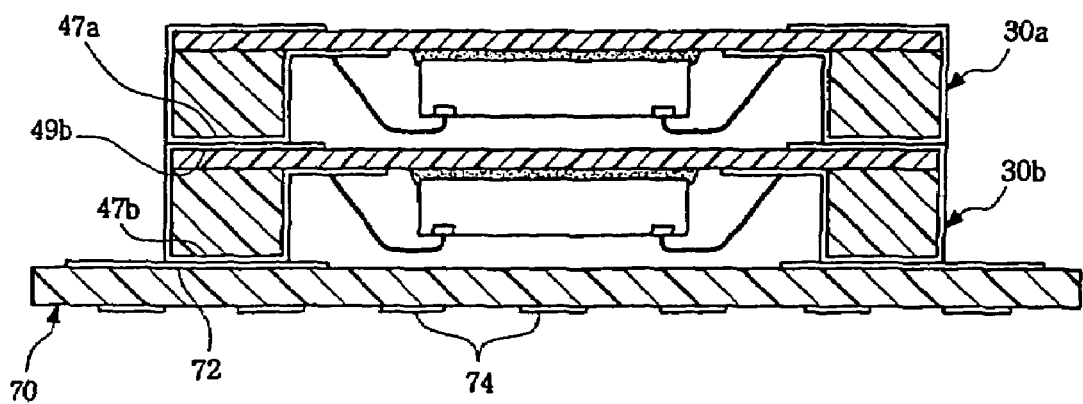
FIG. 7 is a cross-sectional view of a multi-chip package according to an exemplary embodiment of the present invention as illustrated in FIG. 6 with a plurality of connecting boards attached on a printed wiring board.

As illustrated in FIG. 7, each package 30a, 30b of the multi-chip package may then be disposed on the printed wiring board 70. The stacked packages 30a, 30b may be pre-aligned and may be pressed on the printed wiring board 70. Exemplary pressing methods are a thermal compression method and an ultrasonic compression method. The first connecting portion 47b which is located on the lower package 30b may be connected to a printed wiring board pad 72 on an adjacent side of the printed wiring board 70. The second connecting portion 49b of the lower package 30b and the first connecting portion 47a of the upper package 30a may be electrically and mechanically connected by a compression method. The chips of the multi-chip package with the pockets 43 face up or face down with respect to the printed wiring board 70, may be sealed without encapsulation materials. It is also possible to fill the pocket(s) 43 using an epoxy molding compound to further insulate the chip(s). In addition, it is possible to increase the design freedom for each package 30a and 30b by allowing connecting boards 40 to face down or up.

In an exemplary embodiment, the printed wiring board 70 is made of a rigid board or a flexible taped board. The printed wiring board 70 may provide solder ball pads 74 on the rear side to attach to solder balls 90 and the printed wiring board pad 72 on the top side of the printed wiring board 70. The printed wiring board pads 72 may be electrically connected to the solder ball pads 74 through metal-plated via holes inside the multi-layered printed wiring board 70.

Figure 8:
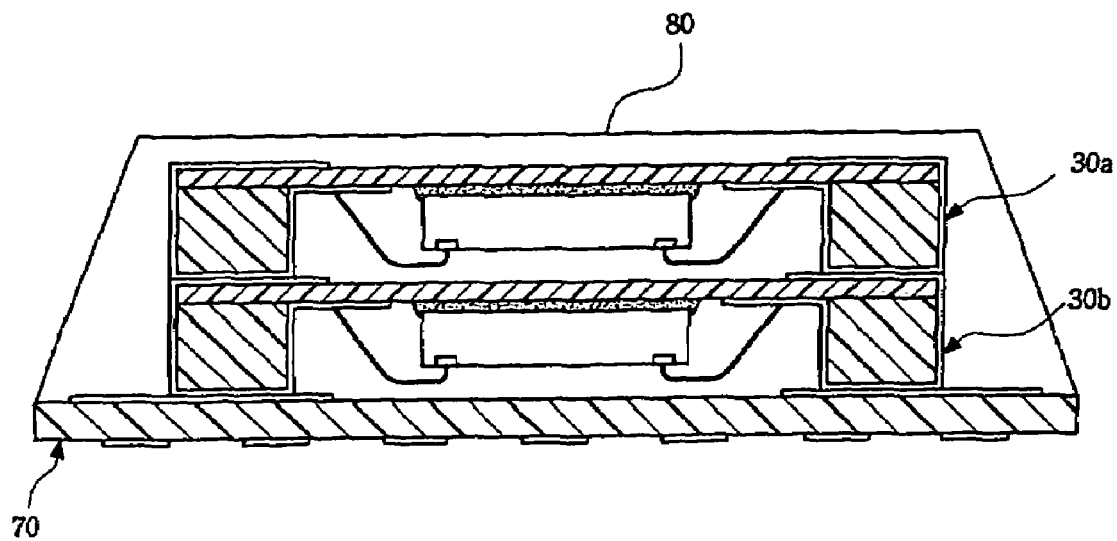
FIG. 8 is a cross-sectional view of a multi-chip package according to an exemplary embodiment of the present invention as illustrated in FIG. 7 with a plurality of connecting boards encapsulated by a resin.

As illustrated in FIG. 8, a multi-chip package body 80 may then be formed around the lower and upper packages 30b and 30a and the connecting boards 40 by encapsulation with an epoxy molding compound or other polymeric composition, in order to protect the chips from, for example, adverse effects of the external environment. The multi-chip package body 80 may be provided by transfer molding method, injecting molding, a screen printing method or a dispensing method.

Figure 9:
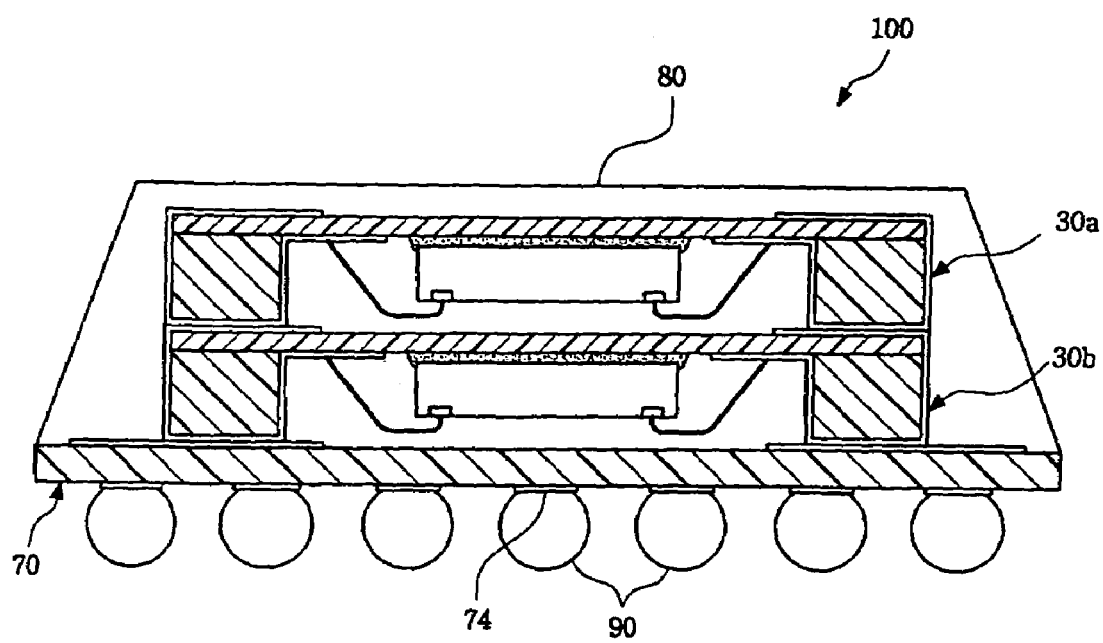
FIG. 9 is a cross-sectional view of a multi-chip package according to an exemplary embodiment of the present invention as illustrated in FIG. 8 with a plurality of solder balls attached on the printed wiring board.

As illustrated in FIG. 9, solder balls 90 may be placed on solder ball pads 74 of the bottom side of the printed wiring board 70. The solder balls 90 are used for electrical connection between the printed wiring board 70 and another board, such as a module board. The solder balls 90 may be formed by ball placement method, plating method, or stencil printing or metal-jet method. A Ni alloy bump and/or Au alloy bump may be used instead of the solder balls. At least two packages 30a, 30b may be stacked and electrically connected to the printed wiring board 70 by the connecting boards 40 in a multi-chip package 100. The number of packages employed can be determined as required.

The multi-chip package structure described above can also be adapted to a system-in module including a memory, a central processing unit (CPU), and other electronic devices in a module. With the configurations of the multi-chip package described above, it is possible to fill the pocket for example, with an epoxy holding compound, to further protect the chip from being adversely affected. In addition, it is possible to enhance the freedom of designing each package by allowing the connecting board to face down or up.

Although exemplary embodiment of the invention have been particularly shown and described in detail herein, it should be understood that many variations and/or modifications of the basic inventive concepts may be undertaken by those of skill in the art without departing from the spirit and scope of the invention as defined by the appended claims.

What is claimed is:

1. A multi-chip package with a plurality of stacked packages including an
upper package and a lower package,
   each package comprising:
      a connecting board having a central opening pocket with a top area;
      at least one chip disposed on the top area;
      a plurality of metal patterns formed on the connecting board and extending to at least a portion of the top area, the metal patterns connecting a first connecting portion to a second connecting portion; and
      a plurality of bonding wires providing electrical connections between bonding pads and a plurality of connecting board pads, the plurality of connecting board pads, extending into the central opening pocket
   wherein the adjacent packages are electrically connected by directly attaching the first connecting portion on the lower package and the second connecting portion on the upper package, the connecting boards of the upper and lower packages being in vertical alignment.

2. A multi-chip package according to claim 1, wherein the plurality of metal patterns are formed on a portion of the top area of a pocket wall and on a side portion which is located outside the pocket.

3. A multi-chip package according to claim 2, wherein the plurality of metal patterns are formed by Au plating.

4. A multi-chip package according to claim 2, wherein the connecting board pads are formed on a peripheral portion of the pocket.

5. A multi-chip package according to claim 1, wherein the first connecting portion and the second connecting portion of the two adjacent stacked packages are positioned in vertical alignment with each other.

6. A multi-chip package according to claim 1, wherein the bonding wires are electrically connected to the corresponding connecting board pads, and are positioned below the portion of the top area of the pocket wall.

7. A multi-chip package according to claim 1, wherein the pockets are face down to a printed wiring board.

8. A multi-chip package according to claim 1, further comprising an encapsulant surrounding the at least one chip for protecting the at least one chip from the external environment.

9. A multi-chip package according to claim 1, wherein the connecting board is made of one selected from a taped circuit board, a printed wiring board and a ceramic board.

10. A multi-chip package according to claim 1, wherein the connecting board includes a first board body and a second board body disposed surrounding on the top side of the first board body.

11. A multi-chip package according to claim 1, wherein the connecting board is formed by creating the central opening for locating the chip in a single board body.

12. A connecting board for a multi-chip package including an upper package and a lower package, the connecting board comprising:
   a lower board, including a wall and an opening, the wall including a top portion and opposed side portions separated by the portion of the top area, wherein the lower package is secured in the opening; an upper board substantially indentical to the lower board, wherein the upper package is secured over the opening of the upper board a connecting portion on the upper and lower boards, extending across the top portion into the opening and across and both of the side portions of the wall of the upper and lower boards and connecting the stacked upper and lower boards.

13. A connecting board according to claim 12, the upper and lower boards further comprising:
a first board, to which the lower or upper package may be secured;
a perimeter board secured to the first board, the perimeter board providing the opening for placement of the lower or upper package, wherein a height of the perimeter board is sufficient to provide height clearance for the lower package when the upper connecting board package is placed on top of the perimeter board.

14. A connecting board according to claim 13, wherein the first board and the perimeter board are integral.

15. A connecting board according to claim 13, wherein the first board includes a centrally located depression for further providing height clearance for the lower package when the upper connecting board is placed on top of the perimeter board.

16. A connecting board according to claim 13, wherein lower the connecting board and an upper connecting board are in vertical or substantially vertical alignment.

17. A connecting board according to claim 13, wherein the perimeter board and a perimeter board of the upper package are in vertical or substantially vertical alignment.

18. A connecting board according to claim 12, wherein the connecting portion is a wiring pattern, the wiring pattern facilitating electrical connection between the upper package and the lower package.

19. A connecting board according to claim 18, the connecting portion including a connecting board pad for a securing a bonding wire line, the other end of the bonding wire being secured to a bonding pad of a chip of the lower package.

20. A connecting board according to claim 19, wherein the connecting board pad is provided in the opening.

21. A connecting board according to claim 18, wherein the connecting portion including a first connecting portion over the perimeter board.

22. A connecting board according to claim 21, wherein the first connecting portion facilitating connection between a second connecting portion of a connecting board of the upper package.

23. A connecting board of claim 22, wherein the first connecting portion of the lower package and the second connecting portion of the connecting board of the upper package are in vertical or substantially vertical alignment.

24. A connecting board according to claim 18, the connecting portion including a second connecting portion over the edge portion of the first board.

25. A connecting board according to claim 24, the second connecting portion facilitating connection between a first connecting portion of a connecting board of an even lower package in the multichip package.

26. A connecting board according to claim 25, wherein the second connecting portion of the lower package and the first connecting portion of the lower connecting board of the even lower package are in vertical or substantially vertical alignment.

27. A connecting board according to claim 12, further comprising: an encapsulant surrounding the lower or upper chip for protecting the lower or upper chip.

28. A connecting board according to claim 12, wherein the connecting board is a taped circuit board, a printed wiring board or a ceramic board.

29. A connecting method for a multi-chip package including an upper package and a lower package, the connecting method comprising:
providing a first connecting board, including a wall and an opening, the wall including a top portion and opposed side portions separated by the top portion, wherein the lower package is secured over the opening and a connecting portion, extending across the top portion into the opening and across and both of the side portions of the wall; and
providing a second connecting board for the upper package, in vertical or substantially vertical alignment with the first connecting board; and
connecting the upper package and the lower package via the connecting portion.

30. A connecting method for a multi-chip package including an upper package and a lower package, each package including a connecting board, each connecting board including a wall and an opening, the wall including a top portion and side portions, method comprising:
providing a first connecting board, including a wall and an opening, the wall including a top portion and opposed side portions separated by the top portion, wherein the lower package is secured over the opening and a connecting portion, extending across the top portion into the opening and across and both of the side portion of the wall; and
providing a second connecting board for the upper package, in vertical or substantially vertical alignment with the first connecting board; and
connecting the upper package and the lower package via the connecting portion.

31. A multi-chip package with a plurality of stacked packages including an
upper package and a lower package,
each package comprising:
a connecting board, each connecting board including a wall and an opening, the wall including a top portion and opposed side portions separated by the top portion, wherein the lower package is secured over the opening and a connecting portion, extending across the top portion and both of the side portion of the wall;
at least one chip disposed on the connecting board;
a plurality of metal patterns formed on the connecting board, the metal patterns connecting a first connecting portion to a second connecting portion; and
a plurality of bonding wires providing electrical connections between bonding pads and a plurality of connecting board pads, the plurality of connecting board pads extending into the central opening pocket
wherein the adjacent packages are electrically connected by directly attaching the first connecting portion on the lower package and the second connecting portion on the upper package, the connecting boards of the upper and lower packages being in vertical alignment.

* * * * *